(12) United States Patent
Mitsuhashi et al.

(10) Patent No.: US 8,670,243 B2
(45) Date of Patent: Mar. 11, 2014

(54) SEMICONDUCTOR MEMORY DEVICE

(75) Inventors: Takeshi Mitsuhashi, Kanagawa (JP);
Hirofumi Katami, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 388 days.

(21) Appl. No.: 13/046,896

(22) Filed: Mar. 14, 2011

(65) Prior Publication Data
US 2011/0228467 A1 Sep. 22, 2011

(30) Foreign Application Priority Data
Mar. 16, 2010 (JP) ................................. 2010-059354

(51) Int. Cl.
*H05K 1/00* (2006.01)

(52) U.S. Cl.
USPC ...... 361/752; 361/679.32; 361/737; 361/783; 361/784

(58) Field of Classification Search
USPC ............................................ 361/679.32, 784
See application file for complete search history.

(56) References Cited

U.S. PATENT DOCUMENTS

| | | | |
|---|---|---|---|
| 6,781,846 B1 * | 8/2004 | Suzuki et al. ................. | 361/737 |
| 6,840,454 B1 | 1/2005 | Rhelimi | |
| 7,172,460 B2 * | 2/2007 | Zhao et al. .............. | 439/607.56 |
| 7,440,286 B2 * | 10/2008 | Hiew et al. .................... | 361/737 |
| 7,768,785 B2 * | 8/2010 | Ni et al. ......................... | 361/715 |
| 7,802,997 B2 * | 9/2010 | Kuo .............................. | 439/76.1 |
| 7,909,654 B2 * | 3/2011 | He et al. ........................ | 439/660 |
| 8,102,657 B2 * | 1/2012 | Hiew et al. .................... | 361/737 |
| 8,297,987 B2 * | 10/2012 | Nguyen et al. ............... | 439/76.1 |
| 2005/0029360 A1 | 2/2005 | Rhelimi | |
| 2005/0164532 A1 * | 7/2005 | Ni et al. .......................... | 439/79 |
| 2005/0180101 A1 * | 8/2005 | Yu et al. ......................... | 361/684 |
| 2007/0127223 A1 * | 6/2007 | Mitsuhashi ................... | 361/752 |
| 2008/0123282 A1 * | 5/2008 | Chiang et al. ................. | 361/686 |

(Continued)

FOREIGN PATENT DOCUMENTS

JP 4-7175 U 1/1992
JP H10-76783 3/1998

(Continued)

OTHER PUBLICATIONS

"μPD720200 Product Overview", <URL:http://www.necel.com/usb/ja/product/upd720200.html>, RENESAS, May 18, 2009, 4 pages (with English Translation).

(Continued)

*Primary Examiner* — Anthony Q Edwards
(74) *Attorney, Agent, or Firm* — Oblon, Spivak, McClelland, Maier & Neustadt, L.L.P.

(57) ABSTRACT

According to one embodiment, semiconductor memory device is capable of operating at a first mode and a second mode which is higher in speed than the first mode. The semiconductor memory device comprising: a semiconductor memory; a controller which controls the semiconductor memory; a connector which is provided with terminals for sending and receiving data to and from an external device; and a substrate on which the semiconductor memory, the controller, and the connector are mounted, the substrate comprising a plurality of wiring layers. The controller and the connector are mounted on an identical surface of the substrate. The substrate comprises a wiring which connects a mounting pad for the terminal for data transfer at the second mode of the connector and a mounting pad for a pin for data transfer at the second mode of the controller to each other on the wiring layer on a mounting surface for the connector and the controller.

17 Claims, 16 Drawing Sheets

(56) References Cited

U.S. PATENT DOCUMENTS

| | | | |
|---|---|---|---|
| 2008/0151487 A1* | 6/2008 | Ni et al. | 361/684 |
| 2010/0091469 A1* | 4/2010 | Lin | 361/752 |
| 2010/0193583 A1* | 8/2010 | Tartavull et al. | 235/375 |
| 2010/0259882 A1* | 10/2010 | Song | 361/679.32 |
| 2011/0188193 A1* | 8/2011 | Yi | 361/679.32 |

FOREIGN PATENT DOCUMENTS

| | | |
|---|---|---|
| JP | 2001-209773 | 8/2001 |
| JP | 2002-525720 | 8/2002 |
| JP | 2007-156682 | 6/2007 |
| JP | 2007-172630 | 7/2007 |
| JP | 2008-3820 | 1/2008 |
| JP | 2008-506192 | 2/2008 |
| JP | 2008-97306 | 4/2008 |
| JP | 2009-37646 | 2/2009 |
| JP | 2009-48542 | 3/2009 |
| JP | 2009-212009 | 9/2009 |
| WO | WO 2006/082793 A1 | 8/2006 |

OTHER PUBLICATIONS

Office Action issued Sep. 10, 2013 in Japanese Office Action No. 2011-034749 (with English translation).

Kamiguchi Shoko, Event Report, What will change besides speeding-up with USB 3.0? Comparison with 2.0, EE Times Japan, May 26, 2009, URL:http://ednjapan.com/edn/articles/0905/26/news095.html.

* cited by examiner

FIRST WIRING LAYER
SECOND WIRING LAYER
THIRD WIRING LAYER
FOURTH WIRING LAYER

|  | CASING | CONTROLLER | MEMORY PACKAGE |
|---|---|---|---|
| CONDITIONS 1 | 102.4 | 132.3 | 127.5 |
| CONDITIONS 2 | 77.7 | 90.5 | 85.5 |
| CONDITIONS 3 | 79.7 | 81.2 | 79.5 |
| CONDITIONS 4 | 82.0 | 83.4 | 81.8 |
| CONDITIONS 5 | 74.2 | 75.9 | 74.3 |
| CONDITIONS 6 | 75.1 | 76.7 | 75.1 |
| CONDITIONS 7 | 68.9 | 70.6 | 69.1 |

SEMICONDUCTOR MEMORY DEVICE

CROSS-REFERENCE TO RELATED APPLICATIONS

This application is based upon and claims the benefit of priority from the prior Japanese Patent Application No. 2010-59354, filed on Mar. 16, 2010; the entire contents of which are incorporated herein by reference.

FIELD

Embodiments described herein relate generally to a semiconductor memory device.

BACKGROUND

A socket complying with USB (Universal Serial Bus) standard is mounted to a wide range of recent information processing devices, and various peripheral devices are connected via the socket.

As the USB standard, four types of specifications of USB1.0, USB1.1, USB2.0, and USB3.0 have been established so far. USB1.1 to USB3.0 are of backward compatibility and required to correctly operate when connecting a lower standard product and an upper standard product to each other except that its function and performance are restricted by the lower standard.

Also, as one of the peripheral devices to be connected to the information processing device via the USB socket, a memory device in which a nonvolatile flash memory and a controller are mounted to a printed substrate together with a USB connector (Standard-A) and housed in a casing, which is a so-called USB memory, has been known (see Japanese Patent Application Laid-Open No. 2007-156682). As the USB memory, products complying with USB2.0 having a maximum transfer speed of 480 Mbits/s are currently predominant.

In recent years, a memory capacity of a USB memory has been steadily increasing. Also, there is a tendency that an amount of data per file handled by an information processing device is increased. Therefore, in order to realize higher speed data transfer between the information processing device and the USB memory, there is a demand for development of a USB memory complying with USB3.0 having a maximum transfer speed of 5 Gbits/s.

Since the backward compatibility is required in the USB standard as described above, the USB memory complying with USB3.0 is required to transfer data at a speed prescribed in the standard in both of the cases of data transfers at USB 3.0 or USB 2.0. However, any specific configuration for realizing the data transfer has not been proposed.

DETAILED DESCRIPTION

In general, according to one embodiment, semiconductor memory device is capable of operating at a first mode and a second mode which is higher in speed than the first mode. The semiconductor memory device comprising: a semiconductor memory; a controller which controls the semiconductor memory; a connector which is provided with terminals for sending and receiving data to and from an external device; and a substrate on which the semiconductor memory, the controller, and the connector are mounted, the substrate comprising a plurality of wiring layers. The controller and the connector are mounted on an identical surface of the substrate. The substrate comprises a wiring which connects a mounting pad for the terminal for data transfer at the second mode of the connector and a mounting pad for a pin for data transfer at the second mode of the controller to each other on the wiring layer on a mounting surface for the connector and the controller.

Exemplary embodiments of semiconductor memory device will be explained below in detail with reference to the accompanying drawings. The present invention is not limited to the following embodiments.

(First Embodiment)

Figure 1:
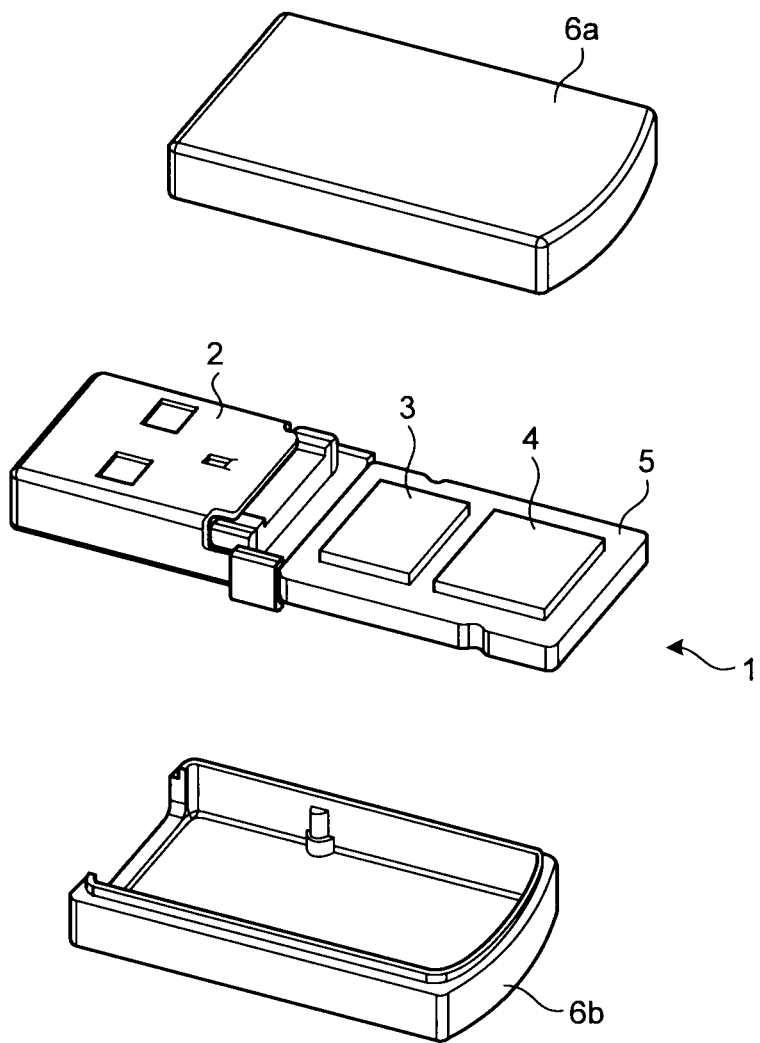
FIG. 1 is an exploded perspective view showing a USB memory according to a first embodiment.

FIG. 1 is an exploded perspective view showing a USB memory according to a first embodiment. A USB memory 1 according to the present embodiment complies with USB3.0 and compatible with USB2.0 due to backward compatibility.

The USB memory 1 has a configuration in which a substrate 5 on which a USB connector 2, a controller 3, a memory package 4, and the like are mounted is housed in a housing including an upper casing 6a and a lower casing 6b. The memory package 4 is a nonvolatile semiconductor memory such as a NAND flash memory. The controller 3 controls the memory package 4 to perform data reading and data writing. The USB connector 2 is an interface for connection with a host device provided with a USB socket and provided with both of a terminal for data transfer at USB3.0 and a terminal for data transfer at USB2.0.

Figure 2:
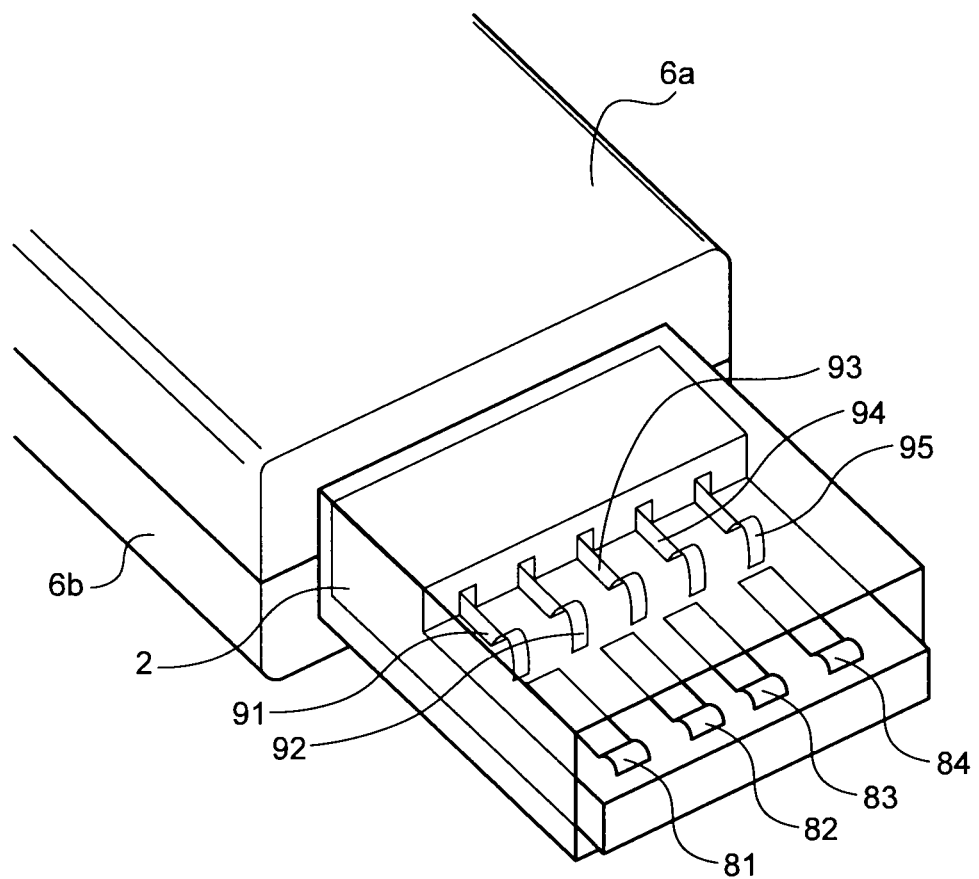
FIG. 2 is a diagram showing arrangement of terminals of a USB connector complying with USB3.0.

FIG. 2 is a diagram showing arrangement of terminals of the USB connector 2 complying with USB3.0. In FIG. 2, an internal part of the USB connector is shown by perspective representation in order to facilitate understanding of arrangement of the terminals. The USB connector 2 is provided with a GND terminal 81, D+ terminal 82, a D− terminal 83, and a VBUS terminal 84 as terminals for data transfer at USB 2.0 at a leading end side in a direction of insertion into USB socket. Also, the USB connector 2 is provided with a SSRX+ terminal 91, a SSRX− terminal 92, a GND terminal 93, a SSTX− terminal 94, and a SSTX+ terminal 95 as terminals for data transfer at USB 3.0 at a tail end side in the direction of insertion into USB socket.

Figure 3A:
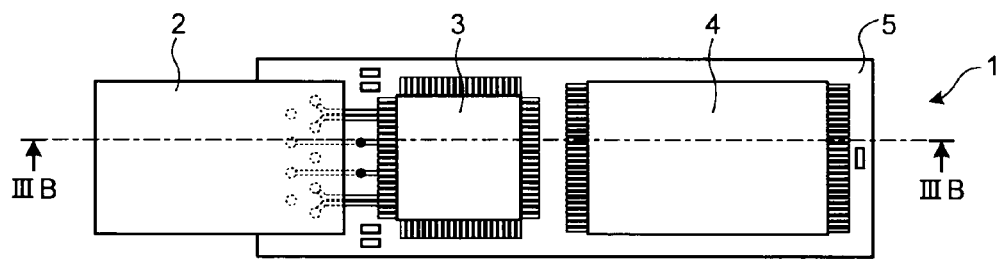
FIGS. 3A to 3D are diagrams showing a configuration of the USB memory according to the first embodiment in a state where an upper casing and a lower casing are not mounted.
Figure 3B:
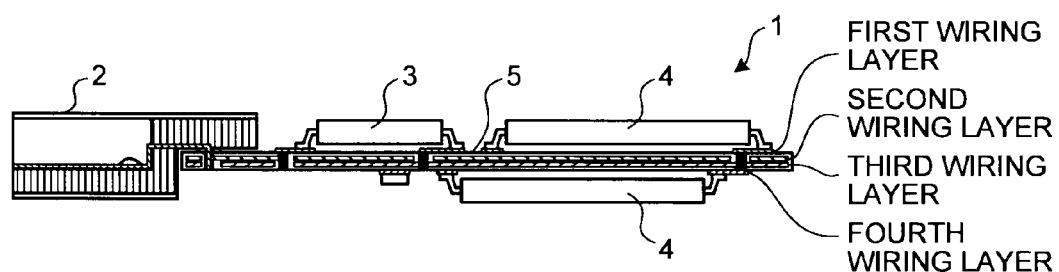
Figure 3C:
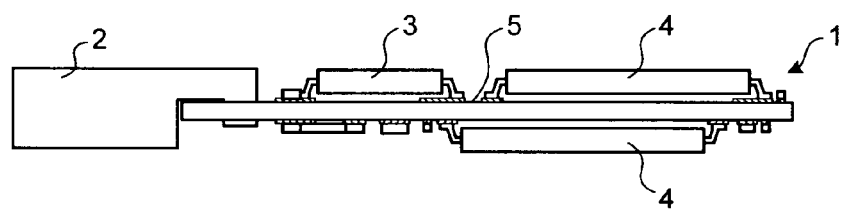
Figure 3D:
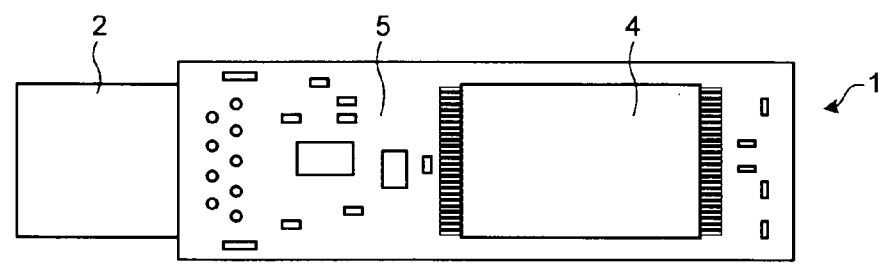

FIGS. 3A to 3D are diagrams showing a configuration of the USB memory 1 in a state where the upper casing 6a and the lower casing 6b are not mounted. FIG. 3A is a top view; FIG. 3B is a side sectional view taken along a line IIIB-IIIB of FIG. 3A; FIG. 3C is a side view; and FIG. 3D is a bottom view. The controller 3 is a QFP (Quad Flat Package) and mounted to the substrate 5 via pins projected from four sides. The substrate 5 is a multilayer substrate provided with wiring layers including two layers provided respectively on top and bottom surfaces thereof and two layers inside. In the following description, the layers are referred to as a first wiring layer, a second wiring layer, a third wiring layer, and a fourth wiring layer from the top surface side as required to distinguish the wiring layers from one another. The USB connector 2 and the controller 3 are mounted on the first wiring layer on the top surface of the substrate 5. The memory package 4 is provided on each of the top surface and the bottom surface (i.e. the first wiring layer and the fourth wiring layer). The memory package 4 may be mounted only on one of the surfaces of the substrate 5, or two or more memory packages may be provided on at least one of the surfaces of the substrate 5.

The memory package 4 has a plurality of internal memory chips. The controller 3 is capable of partially using the memory package 4 by dividing the memory package 4 by the unit of chip by controlling a ready/busy pin or a chip enable pin of the memory package 4. The controller 3 is capable of simultaneously operating the plurality of chips inside the memory package 4 by the unit of chip or operating a plurality of packages by the unit of package by using an interleave function and a parallel mode function. The controller 3 is capable of sending and receiving data at a high speed to and from the memory package 4 by simultaneously driving the plurality of memory packages 4 and the plurality of memory chips inside the memory packages 4.

Since the USB memory 1 according to the present embodiment is compatible with USB2.0 by the backward compatibility, a wiring between terminals of a USB connector of USB2.0 standard and pins of a controller will be described first as a reference example gathered by the inventor.

Figure 4:
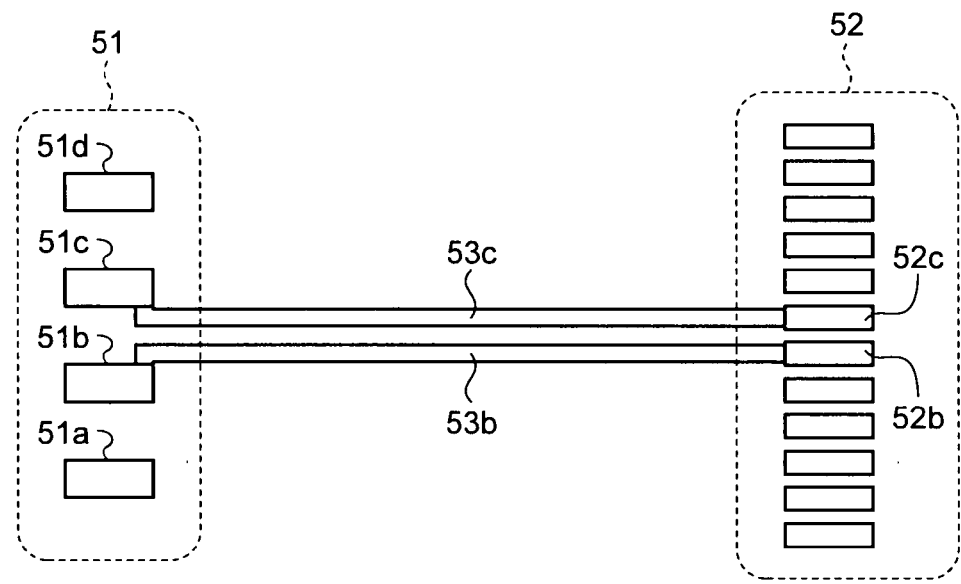
FIG. 4 is a diagram showing one example of connection between terminals of a USB connector and pins of a controller in a USB memory complying with USB2.0.

FIG. 4 is a diagram showing one example of connection between terminals of a USB connector and pins of a controller in a USB memory complying with USB2.0. A connector mounting pad 51 of the USB2.0 memory is formed of a VBUS pad 51a, a D− pad 51b, a D+ pad 51c, and a GND pad 51d corresponding to four terminals of the USB2.0 (VBUS terminal, D− terminal, D+ terminal, GND terminal). In contrast, since the controller is provided with signal terminals required for data control and transfer of the USB memory, a controller mounting pad 52 is provided with pads corresponding to the terminals. However, only a D+ pad 52c and a D− pad 52b on which a D+ terminal and a D− terminal required for data transfer are mounted are specifically shown for brevity of description.

In USB2.0, differential wirings (D+ wiring 53c, D− wiring 53b) are amplified at 400 mV to transfer data when transferring data of 480 Mbps. In the data transfer, switching noise, signal skew, electromagnetic wave, and the like are generated to induce adverse influences such as transfer speed reduction, unstable operation, data reliability degradation, and the like.

Figure 5:
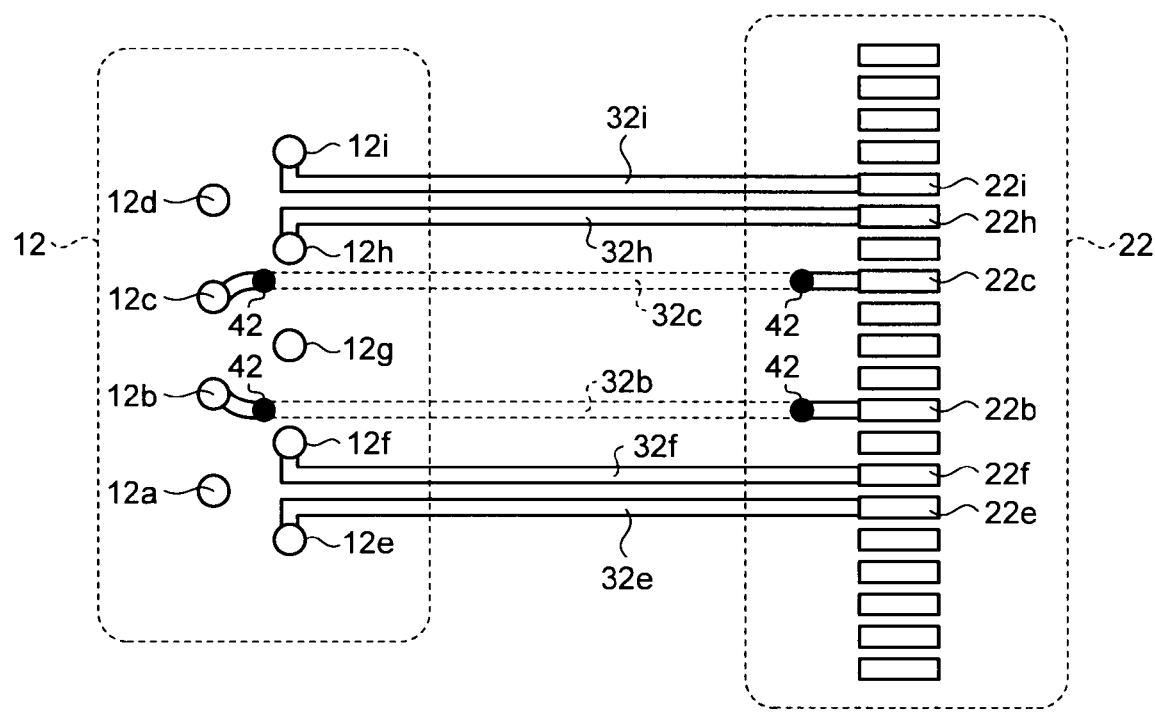
FIG. 5 is a diagram showing one example of connection between terminals of a USB connector and pins of a controller in a substrate of the USB memory according to the first embodiment.

FIG. 5 is a diagram showing one example of connection between the terminals of the USB connector 2 and the pins of the controller 3 in the substrate 5 of the USB memory 1. In USB3.0, four differential signals to be used for data control and transfer at 5 Gbps are added with the signal lines (VBUS, D−, D+, GND) used at USB2.0 being left as they are in order to ensure the backward compatibility with USB2.0. The signal lines are parallel to one another and equal in length which is the shortest possible length.

A USB connector mounting pad 12 of the USB memory 1 are formed of nine pads including four pads which are a VBUS pad 12a, a D− pad 12b, a D+ pad 12c, and a GND pad 12d corresponding to the terminals (VBUS terminal 84, D− terminal 83, D+ terminal 82, GND terminal 81) used for USB2.0 and five pads which are a SSRX+ pad 12i, a SSRX− pad 12h, a GND pad 12g, a SSTX− pad 12f, a SSTX+ pad 12e corresponding to five terminals (SSRX+ terminal 91, SSRX− terminal 92, GND terminal 93, SSTX− terminal 94, and SSTX+ terminal 95) added for USB3.0.

A SSTX+ wiring 32e and a SSTX− wiring 32f are data sending side differential pair signals (super speed transmitter differential), and a SSRX+ wiring 32i and a SSRX− wiring 32h are data receiving side differential pair signals (super speed receiver differential). The USB memory 1 realizes data transfer at 5 Gbps by these two pairs of differential signal lines.

Since the controller 3 is provided with the signal terminals required for data control and transfer of the USB memory 1, the controller mounting pad 22 is provided with pads corresponding to these terminals. However, only the pads connecting the terminals directly involved in the data transfer operation are specifically shown for brevity of description. The controller mounding pad 22 is provided with a D+ pad 22c, a D− pad 22b, a SSTX+ pad 22e, a SSTX− pad 22f, a SSRX+ pad 22i, and a SSRX− pad 22h on which differential pair signal pins for D+, D−, SSTX+, SSTX−, SSRX+ and SSRX− are mounted for data transfer.

In the USB connector mounting pad 12 and the controller mounting pad 22, the pads for the identical signal are connected. The differential signal pair lines of the SSTX+ wiring 32e and the SSTX− wiring 32f and the differential pair signal lines of the SSRX+ wiring 32i and the SSRX− wiring 32h are disposed on the first wiring layer on the top surface of the substrate 5 in such a fashion that the lines are parallel to each other and equal in length. By providing the differential pair wirings for USB3.0 on the first wiring layer which is the component mounting surface, it is possible to suppress the generation of switching noise, signal skew, and electromagnetic wave.

In contrast, differential pair wirings of a D+ wiring 32c and a D− wiring 32b are guided via through-holes 42 to the second wiring layer which is different from the first wiring layer serving as the component mounting wiring layer and connected to each other via the second wiring layer. Since the wirings for data transfer at USB2.0 are provided on the second wiring layer which is different from the component mounting surface, it is possible to ensure degree of freedom in arrangement of other components on the substrate. The D+ wiring 32c and the D− wiring 32b are parallel to each other and equal in length which is the shortest possible length.

As described above, the USB connector 2 and the controller 3 are mounted on the identical surface of the substrate 5 in the present embodiment. With such configuration, it is no longer necessary to form the wirings connecting the USB connector 2 and the controller 3 over a plurality of wiring layers.

In addition to the configuration, in the present embodiment, the wirings to be used for connecting the terminals for data transfer at USB3.0 of the USB connector 2 to the pins for data transfer at USB3.0 of the controller 3 are provided on the first wiring layer on the top surface of the substrate 5, whereas the wirings to be used for connecting the terminals for data transfer at USB2.0 of the USB connector 2 to the pins for data transfer at USB2.0 of the controller 3 are provided on the second wiring layer inside the substrate 5. Among the six wirings including the two differential signal lines for the USB2.0 and the four differential signal lines for USB3.0, only the four wirings for the data transfer at USB3.0 are provided on the first wiring layer, thereby making it possible to reduce an area to be occupied by the wirings between the USB connector 2 and the controller 3 on the top surface of the substrate 5. With such configuration, it is possible to ensure an area to which components such as an LED and a passive element are mounted between the USB connector 2 and the controller 3 on the top surface of the substrate 5, and an optimum component arrangement is easily attained. Therefore, it is possible to realize performance improvement and a cost reduction while reducing the area of the substrate 5. In other words, it is possible to realize the small USB memory with high performance at a low cost. Also, the same effect is attained when the D+ wiring 32c and the D− wiring 32b are provided on the third wiring layer or the fourth wiring layer.

Further, since the differential wiring pair for data transfer at USB3.0 which is capable of higher data transfer than USB2.0 is provided on the top surface of the first wiring layer and connected without using any through-hole, it is possible to suppress signal degradation which is otherwise caused by influence of the through-hole at the high speed transfer at USB3.0. Since the data transfer at USB2.0 is performed at a speed lower than the data transfer at USB3.0, realization of the transfer speed prescribed in the standard is hardly prevented when a signal is somewhat degraded by the through-holes 42.

Also, in the present embodiment, the configuration in which the arrangement of the pads of the USB connector mounting pad 12 is the same as the arrangement of the terminals is exemplified, but the pad arrangement and the terminal arrangement are not necessarily the same. More specifically, since what is prescribed as the USB standard is the arrangement of terminals, it is possible to dispose the pads at arbitrary positions. For examples, the pads forming the connector mounting pad 12 may be disposed in arrangement different from that of the terminals by sterically intersecting the terminals inside the USB connector 2.

(Second Embodiment)

Figure 6A:
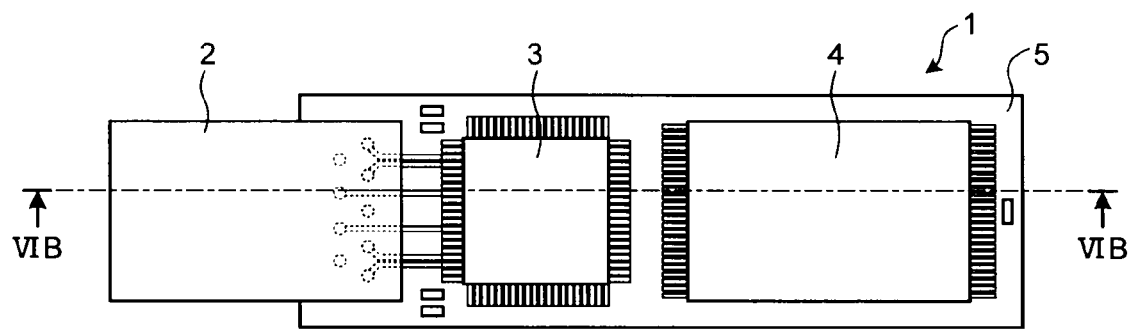
FIG. 6A and FIG. 6B are diagrams showing a configuration of a USB memory according to a second embodiment in a state where an upper casing and a lower casing are not mounted.
Figure 6B:
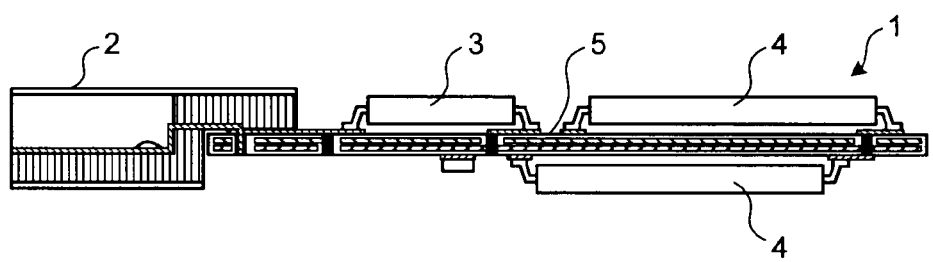

FIG. 6A and FIG. 6B are diagrams showing a configuration of a USB memory 1 according to a second embodiment in a state where an upper casing and a lower casing are not mounted. FIG. 6A is a top view, and FIG. 6B is a side sectional view taken along a line VIB-VIB of FIG. 6A. Lateral surfaces and a bottom surface are the same as those of the first embodiment. Like the first embodiment, the USB memory 1 according to the second embodiment has a configuration in which a substrate 5 on which a USB connector 2, a controller 3, a memory package 4, and the like are mounted is housed in a housing formed of an upper casing and a lower casing.

Figure 7:
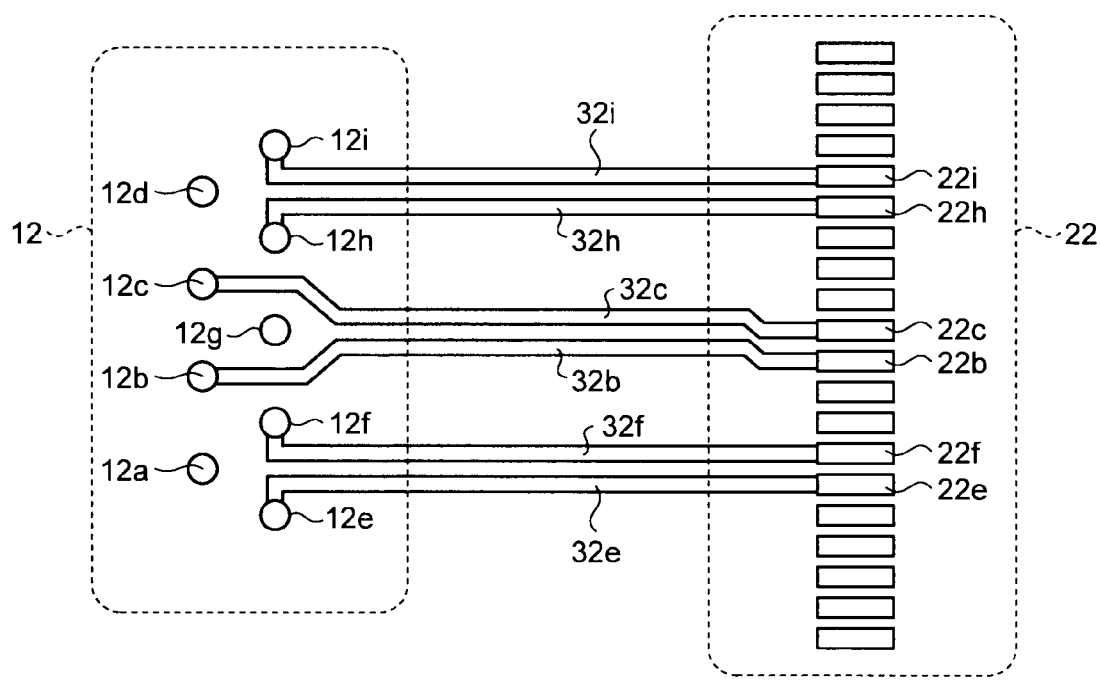
FIG. 7 is a diagram showing one example of connection between terminals of a USB connector and pins of a controller in a substrate of the USB memory according to the second embodiment.

FIG. 7 is a diagram showing one example of connection between terminals of the USB connector 2 and pins of the controller 3 in the substrate 5 of the USB memory 1. In the present embodiment, wirings for data transfer at USB2.0 (D+ wiring 32c, D− wiring 32b) are formed on a first wiring layer. The D+ wiring 32c and the D− wiring 32b are parallel to each other and equal in length which is the shortest possible length.

Since the wirings for data transfer at USB2.0 are formed on the first wiring layer and parallel to each other and equal in length which is the shortest possible length, it is possible to reduce signal degradation in the data transfer at USB2.0 as compared to the configuration of the first embodiment. In short, an error hardly occurs during the data transfer at USB2.0 in the USB memory 1 according to the present embodiment. Since other features are the same as those of the first embodiment, the overlapping description is not repeated.

(Third Embodiment)

Figure 8A:
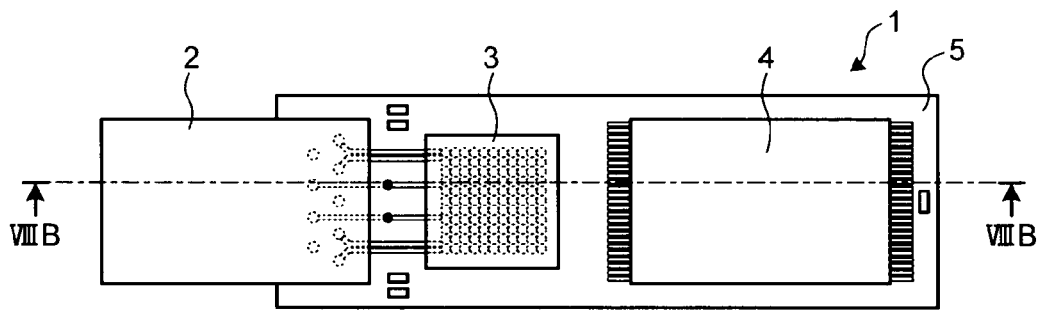
FIG. 8A to FIG. 8D are diagrams showing a configuration of a USB memory according to a third embodiment in a state where an upper casing and a lower casing are not mounted.
Figure 8B:
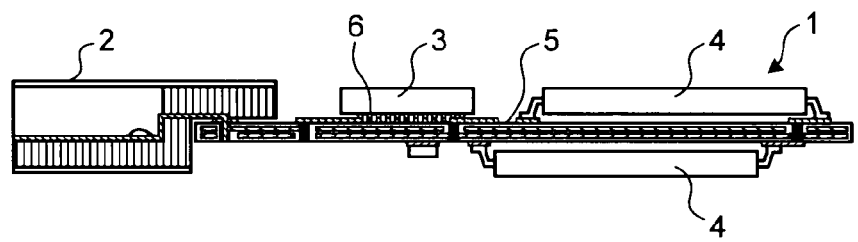
Figure 8C:
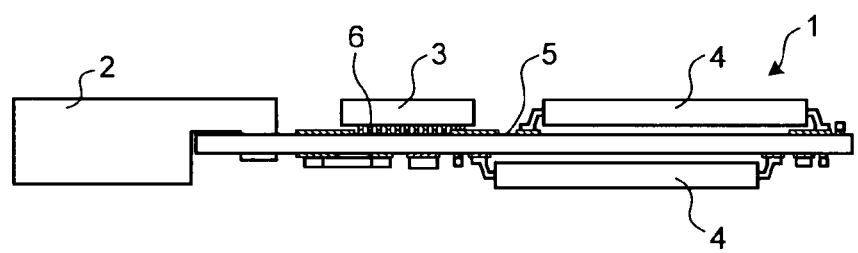
Figure 8D:
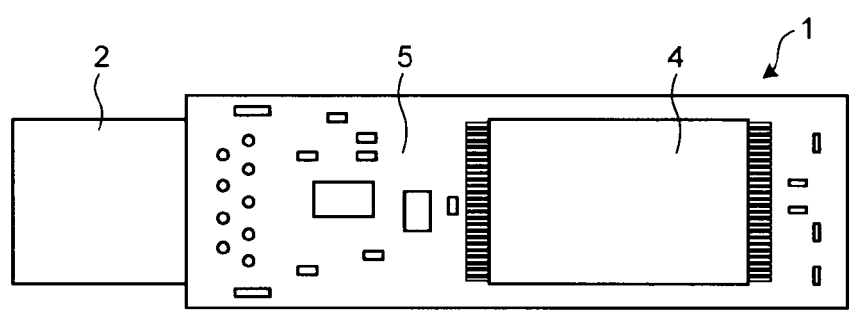

FIG. 8A to FIG. 8D are diagrams showing a configuration of a USB memory 1 according to a third embodiment in a state where an upper casing and a lower casing are not mounted. FIG. 8A is a top view; FIG. 8B is a side-sectional view taken along a line VIIIB-VIIIB of FIG. 8A; FIG. 8C is a side view; and FIG. 8D is a bottom view. Like the first embodiment, the USB memory 1 according to the third embodiment has a configuration in which a substrate 5 on which a USB connector 2, a controller 3, a memory package 4, and the like are mounted is housed in a housing formed of an upper casing and a lower casing. However, the controller 3 is a BGA (Ball Grid Array) and mounted to the substrate 5 via bumps 6 aligned on a bottom surface of the package. Since BGA is used for the controller 3, signal degradation due to electrical connection to the substrate 5 is suppressed, and high speed data transfer is more smoothly realized.

Pins (SSTX+, SSTX−, SSRX+, SSRX−) to be used for data transfer at USB3.0 are disposed at a peripheral part of the controller 3 and a side where the USB connector 2 is mounted. With such configuration, it is possible to provide wirings for data transfer at USB3.0 on a first wiring layer on a top surface of the substrate 5 in a substantially shortest distance without the necessity of avoiding other pins.

In contrast, pins (D+, D−) to be used for data transfer at USB2.0 are also disposed on the peripheral part of the controller 3 and the side on which the USB connector 2 is mounted, and wirings for data transfer are guided by through-holes to a second wiring layer inside the substrate 5 via short wirings from a D+ pad and a D− pad on the first wiring layer.

Like the first and second embodiments, in the present embodiment, among six wirings including two differential signal lines for USB2.0 and four differential signal lines for USB3.0, only the four lines for data transfer at USB3.0 are wired on the first wiring layer, and, therefore, it is possible to reduce a space to be occupied by the wirings between the USB connector 2 and the controller 3 on the top surface of the substrate 5. With such configuration, since it is possible to ensure an area to which components such as an LED and a passive element are mounted between the USB connector 2 and the controller 3 on the top surface of the substrate 5, optimum component arrangement is easily attained. Thus, it is possible to realize performance improvement and a cost reduction while reducing a substrate area.

Also, since a differential wiring pair for data transfer at USB3.0 at which data are transferred at a higher speed is provided on the first wiring layer on the top surface of the substrate 5 and connected without using any through-hole, it is possible to suppress signal deterioration which can be caused by influence of the through-hole during high speed transfer at USB3.0. Since the data transfer at USB2.0 is performed at a speed lower than the data transfer at USB3.0, the signal deterioration which can be caused by the through-hole is hardly be a problem.

Figure 9:
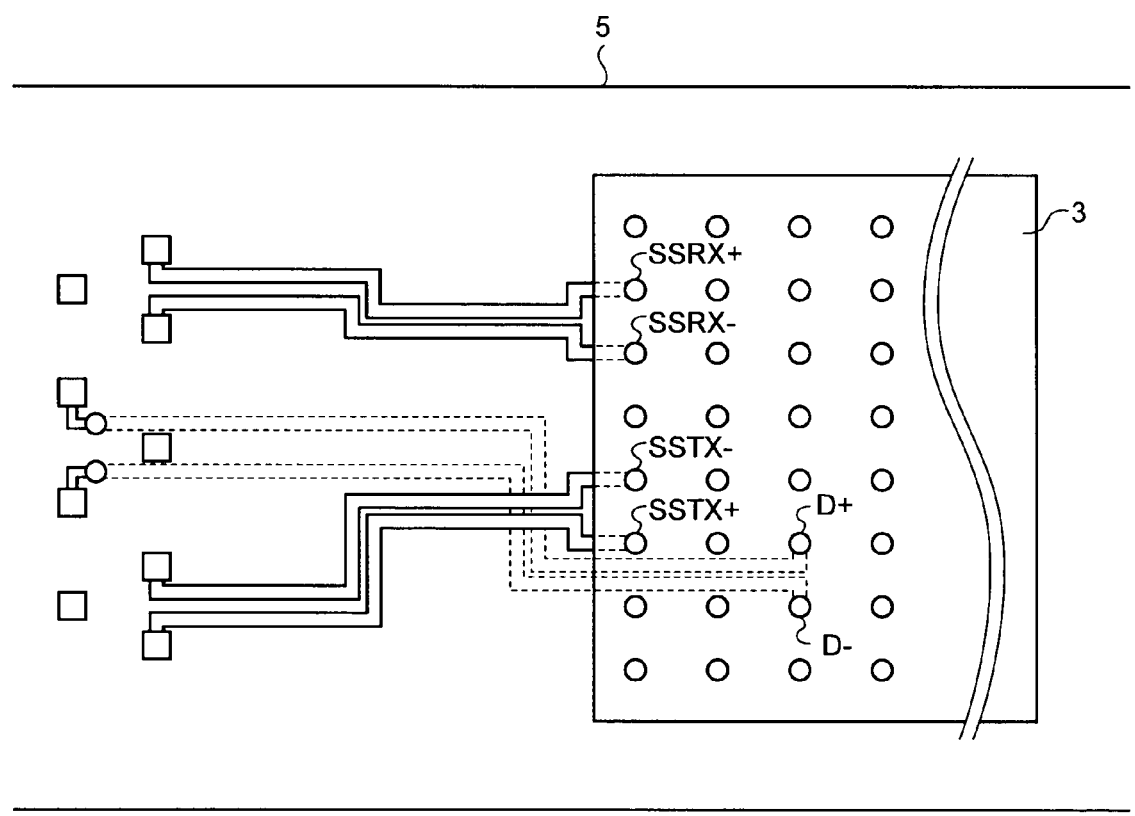
FIG. 9 is a diagram showing one example of connection in the case where any pin for data transfer at USB2.0 is not allocated at a peripheral part of the controller and a side where the USB connector are mounted.

FIG. 9 is a diagram showing one example of connection in the case where any pin for data transfer at USB2.0 is not allocated at a peripheral part of the controller 3 and a side where the USB connector 2 are mounted. The pins (SSTX+, SSTX−, SSRX+, SSRX−) to be used for data transfer at USB3.0 are mounted on the peripheral part of the controller 3 and the side where the USB connector 2 is mounted. In contrast, the pins (D+, D−) to be used for data transfer at USB2.0 are disposed at a central portion of the controller 3. The wirings for data transfer at USB2.0 are guided to a second, third, or fourth wiring layer directly or via through-holes via shortest possible wirings and connected in such a manner as to avoid (in other words, to sterically intersect) the wirings for data transfer at USB3.0 in a direction of thickness of the substrate 5. As described in first embodiment, since the speed of the data transfer at USB2.0 is lower than that of the USB3.0, the wirings which are so provided as to pass the second, third, or fourth wiring layer via through-holes hardly prevent the realization of the data transfer speed prescribed in the standard. Therefore, with such configuration, it is possible to realize the data transfer speed prescribed in the standard at both of the USB3.0 and USB2.0 even in the case where it is difficult to dispose all of the pins for data transfer at USB3.0 and all of the pins for data transfer at USB2.0 on the peripheral part of the controller 3 and the side where the USB connector 2 is mounted.

Since other features are the same as those of the first embodiment, the overlapping description is not repeated.

(Fourth Embodiment)

Figure 10A:
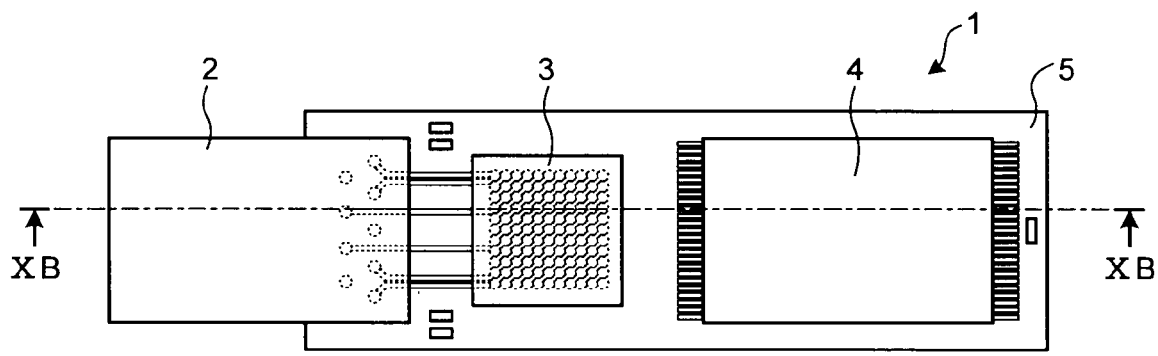
FIG. 10A and FIG. 10B are diagrams showing a configuration of a USB memory according to a fourth embodiment in a state where an upper casing and a lower casing are not mounted.
Figure 10B:
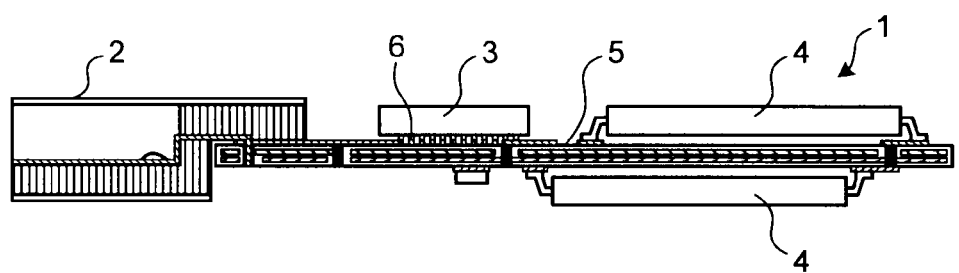

FIG. 10A and FIG. 10B are diagrams showing a configuration of a USB memory 1 according to a fourth embodiment in a state where an upper casing and a lower casing are not mounted. Like the first to third embodiments, the USB memory 1 according to the present embodiment has a configuration in which a substrate 5 on which a USB connector 2, a controller 3, a memory package 4, and the like are mounted is housed in a housing formed of an upper casing and a lower casing. FIG. 10A is a top view, and FIG. 10B is a side sectional view taken along a line XB-XB of FIG. 10A. Lateral surfaces and a bottom surface are the same as those of the third embodiment.

The feature that the controller 3 is a BGA and mounted to the substrate 5 via bumps 6 aligned on a bottom surface of the package is the same as the third embodiment. Since the BGA is used for the controller 3, signal degradation due to electrical connection to the substrate 5 is suppressed, and high speed data transfer is more smoothly realized.

Also, the feature that wirings for data transfer at USB2.0 are provided on a first wiring layer is the same as the second embodiment. Since the wirings for data transfer at USB2.0 are formed on the first wiring layer and parallel to each other and equal in length which is the shortest possible length, it is possible to reduce signal degradation in the data transfer at USB2.0 as compared to the configuration of the first embodiment. In short, an error hardly occurs during the data transfer at USB2.0 in the USB memory 1 according to the present embodiment.

Since other features are the same as those of the first embodiment, the overlapping description is not repeated.

(Fifth Embodiment)

Figure 11A:
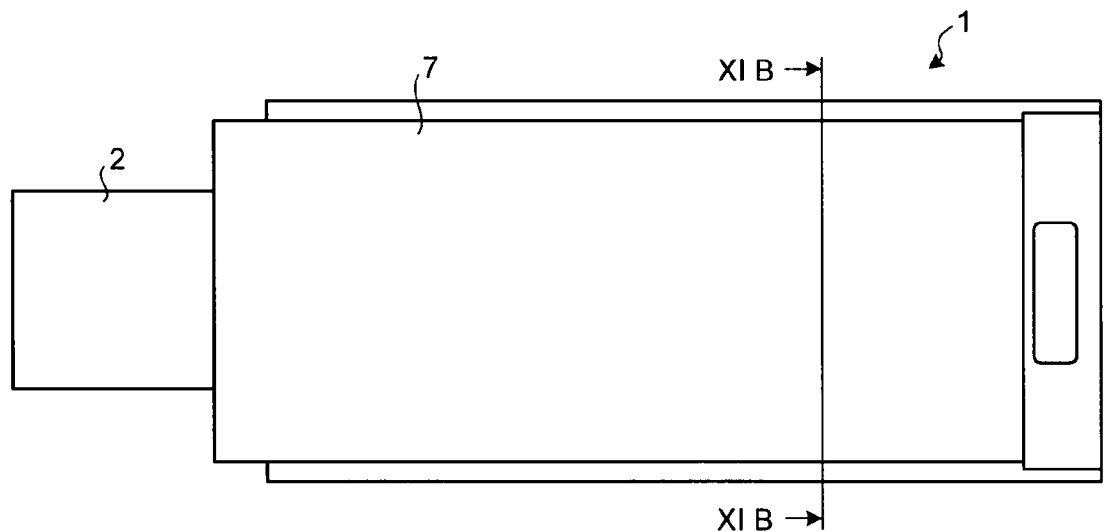
FIG. 11A to FIG. 11C are diagrams showing a configuration of a USB memory according to a fifth embodiment.
Figure 11B:
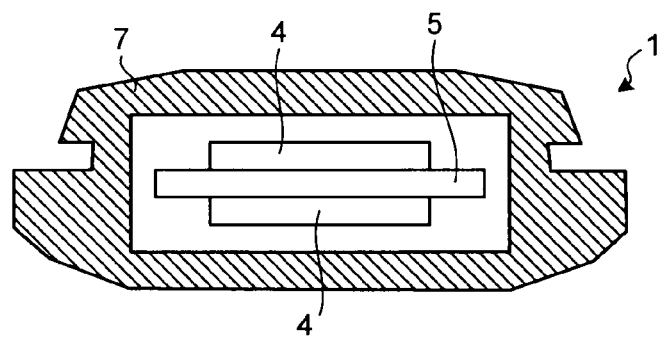
Figure 11C:
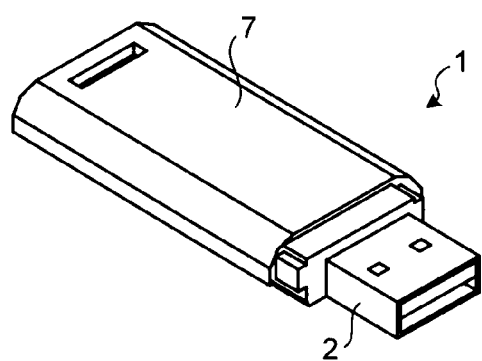

FIG. 11A to FIG. 11C are diagrams showing a configuration of a USB memory 1 according to a fifth embodiment. FIG. 11A is a top view of the USB memory 1; FIG. 11B is a sectional view taken along a line XIB-XIB of FIG. 11A; and FIG. 11C is a perspective view of the USB memory 1. In the present embodiment, a housing 7 is formed by using aluminum as a material. A substrate 5 and a USB connector 2, a controller 3, a memory package 4, and the like mounted to the substrate 5 housed inside the housing 7 are the same as the first embodiment. In short, the configuration of the USB memory 1 in a state where the housing 7 is not attached is the same as the configuration shown in FIG. 3A to FIG. 3D.

A width of the housing in the present embodiment is the same as that of a resin housing of a USB memory dedicated to USB2.0. The resin housing of the USB memory dedicated to USB2.0 has a surface temperature of 60° C. or lower when the USB memory operates at USB2.0 under the atmosphere of 25° C.

In the present embodiment, since the housing 7 is formed by using aluminum having high heat conductivity as the material, heat generated from the controller 3, the memory package 4, the passive element on the substrate 5, and the like is easily discharged to the outside when performing data transfer by connecting the USB connector 2 to an external device. Therefore, it is possible to prevent unstable operation which can be caused by excessive heating of the controller 3 and the memory package 4. Also, it is possible to prevent degradation of mechanical strength which can e caused by a heat stress exerted on the components to be mounted on the substrate 5 such as the USB connector 2, the controller 3 and the memory package 4. Further, since it is possible to suppress the surface temperature of the housing 7, it is possible to enhance safety.

(Sixth Embodiment)

Figure 12A:
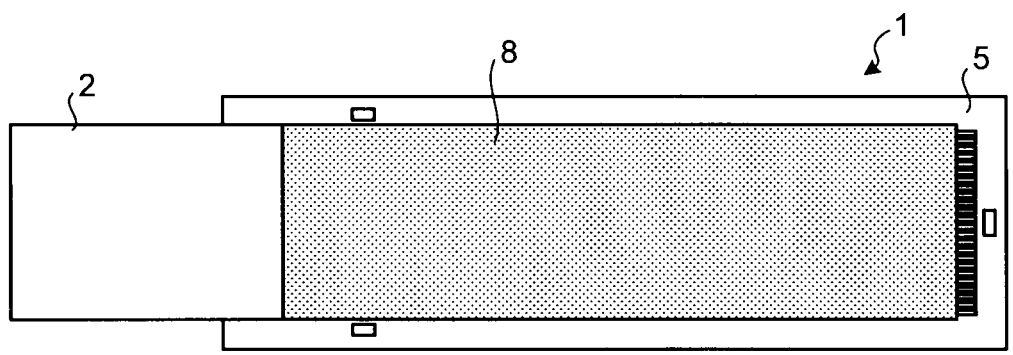
FIG. 12A to FIG. 12F are diagrams showing a configuration of a USB memory according to a sixth embodiment.
Figure 12B:
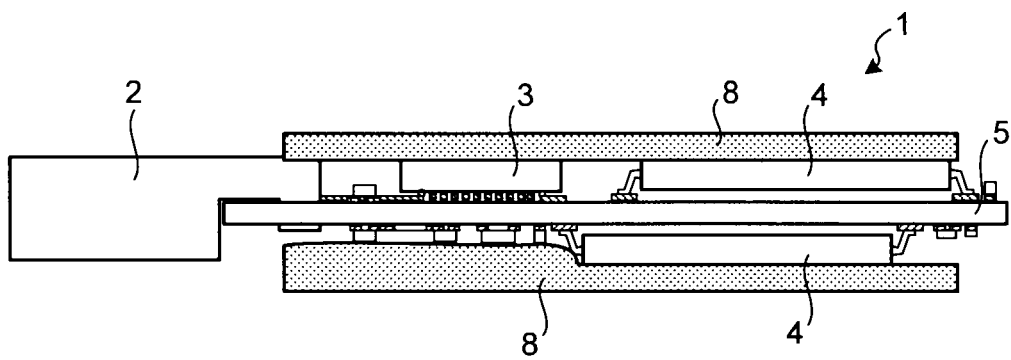
Figure 12C:
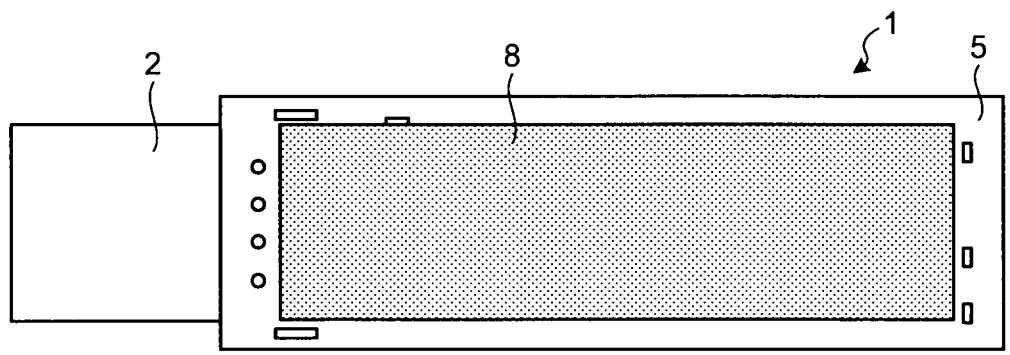
Figure 12D:
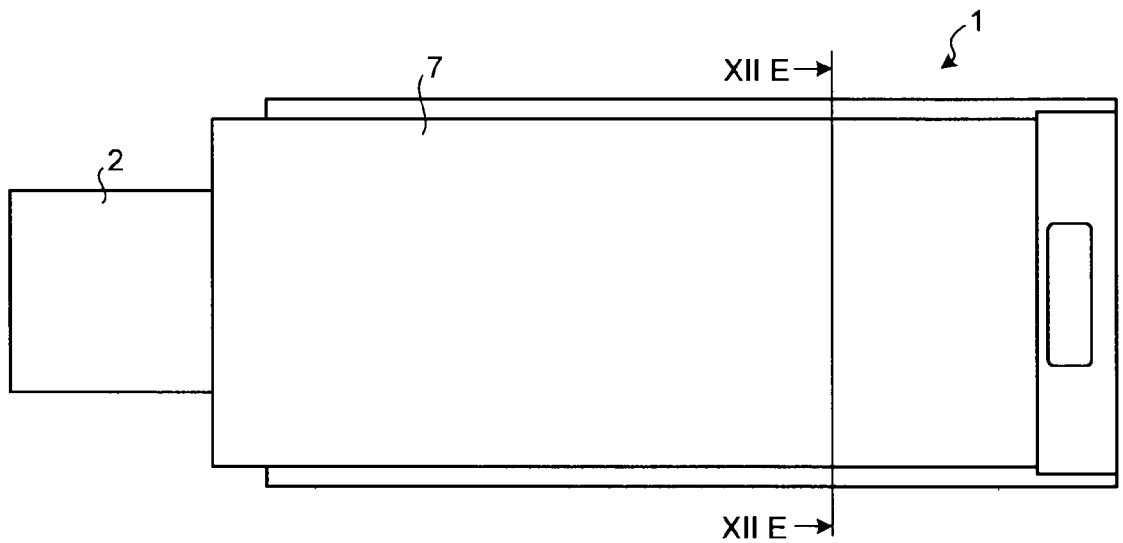
Figure 12E:
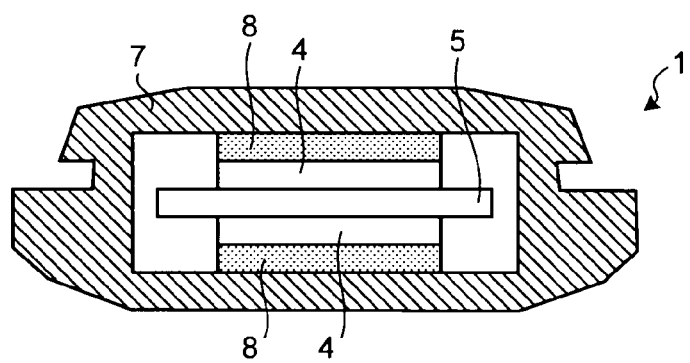
Figure 12F:
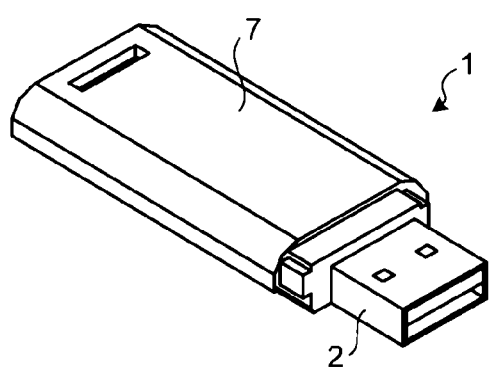

FIG. 12A to FIG. 12F are diagrams showing a configuration of a USB memory 1 according to a sixth embodiment. FIG. 12A is a top view showing the USB memory 1 in a state where a housing 7 is not attached; FIG. 12B is a side view showing the USB memory 1 in the state where the housing 7 is not attached; FIG. 12C is a bottom view showing the USB memory 1 in the state where the housing 7 is not attached; FIG. 12D is a top view showing the USB memory 1; FIG. 12E is a sectional view taken along a line XIIE-XIIE of FIG. 12D; and FIG. 12F is a perspective view showing the USB memory 1. In the USB memory 1 according to the present embodiment, a heat discharge sheet 8 used as a heat discharge member is disposed on a controller 3, a memory package 4, and components mounted on a substrate 5. Other features and a width of the housing 7 are the same as those of the fifth embodiment.

As shown in FIG. 12E, the heat discharge sheet 8 thermally connects the controller 3, the memory package 4, the components mounted on the substrate 5, and the like to the housing 7. A silicone rubber, for example, may be used as a material for the heat discharge sheet 8. Also, a material obtained by mixing a metal oxide having relatively high heat conductivity, boron nitride, or the like as an inorganic filler with a base material such as the silicone rubber may be used.

The configuration of disposing the heat discharge sheet 8 over the controller 3 and the memory package 4 is exemplified herein, but the heat discharge sheet 8 may be partially disposed only on a component which is a heat generation source such as the controller 3 and the memory package 4. Also, by increasing an area of the heat discharge sheet 8 to be larger than an area occupied by the controller 3 and the memory package 4 on the substrate 5, it is possible to improve a heat discharge property by increasing heat capacity of the heat discharge sheet 8.

As a method for disposing the heat discharge sheet 8 between the controller 3 and the memory package 4 and the housing, the heat discharge sheet 8 may be attached by attaching the heat discharge sheet 8 to a side of the controller 3 and the memory package 4 and then covering the substrate 5 with the housing 7 or by covering the substrate 5 with the housing 7 to which the heat discharge sheet 8 is attached in advance of the covering.

In the present embodiment, movement of heat generated in the controller 3, the memory package 4, and the like to the housing 7 is accelerated by the heat discharge sheet 8. Therefore, it is possible to attain a superior effect of preventing unstable operation due to excessive heating of the controller 3 and the memory package 4 and mechanical strength degradation due to heat stress exerted on the components mounted to the substrate 5 such as the USB connector 2, the controller 3 and the memory package 4 than that attained by the fifth embodiment. Also, since it is possible to suppress a surface temperature of the housing 7 to be lower than that of the fifth embodiment, it is possible to further enhance safety.

(Seventh Embodiment)

Figure 13A:
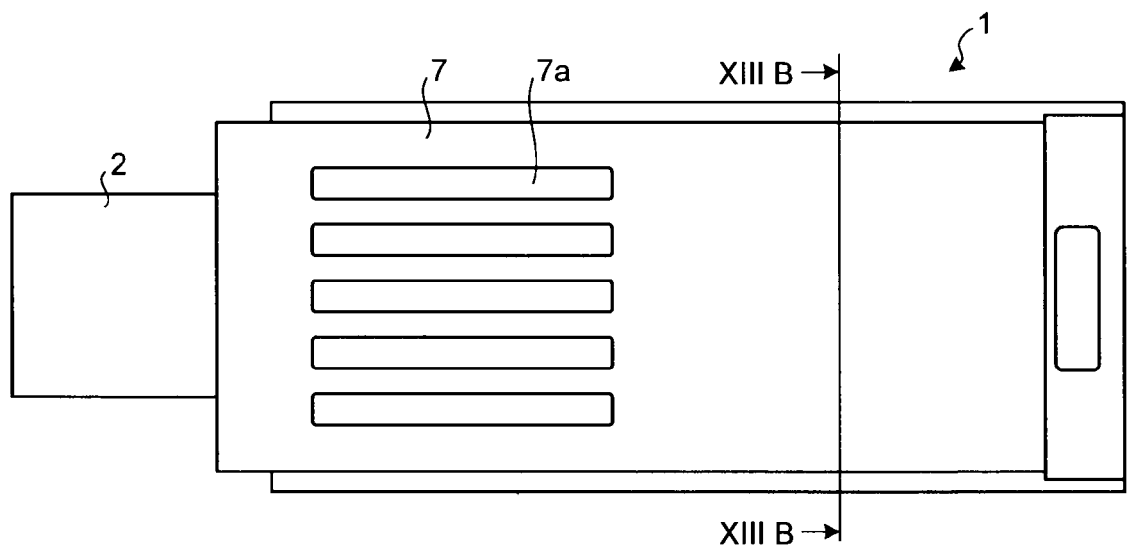
FIG. 13A to FIG. 13C are diagrams showing a configuration of a USB memory according to a seventh embodiment.
Figure 13B:
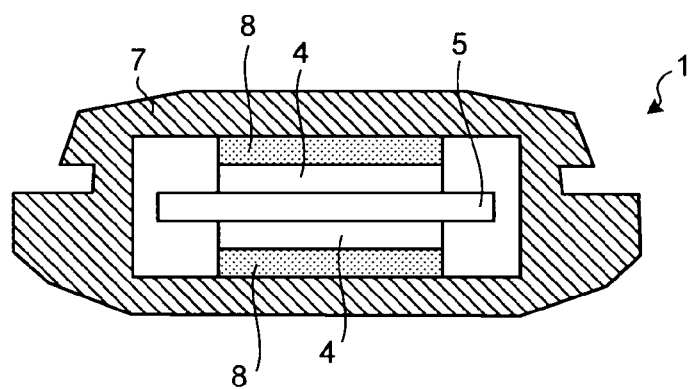
Figure 13C:
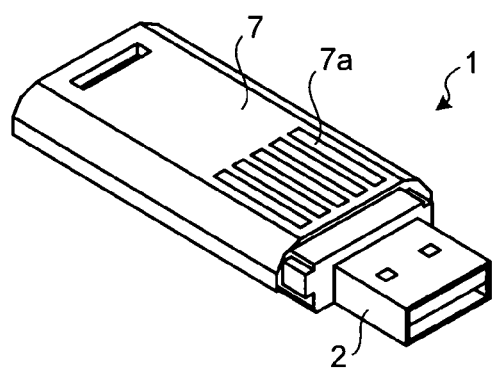

FIG. 13A to FIG. 13C are diagrams showing a configuration of a USB memory 1 according to a seventh embodiment. FIG. 13A is a top view showing the USB memory 1; FIG. 13B is a sectional view taken along a line XIIIB-XIIIB of FIG. 13A; and FIG. 13C is a perspective view showing the USB memory 1. The USB memory 1 in a state where a housing 7 is not attached is the same as that of the sixth embodiment.

In the present embodiment, the hosing 7 is provided with slit openings 7a on a surface. More specifically, the present embodiment has a configuration that a heat discharge effect is improved by discharging heat inside the housing 7 from the slit openings 7a. The configuration of the USB memory 1 is the same as that of the sixth embodiment except for the slit openings 7a provided on the housing 7.

By the formation of the slit openings 7a, a section of the housing 7 is exposed around each of the slit openings 7a though a surface of the housing 7 is partially removed. Therefore, it is possible to increase a surface area of the housing 7 by reducing a width of the slit opening 7a to be smaller than about a half of a plate thickness of the housing 7. Also, since a heat discharge sheet 8 is exposed at an opening portion of the slit opening 7a, heat is discharge to an outside of the housing 7 directly from the heat discharge sheet 8. Therefore, when a sum of a heat discharge amount from the section of the housing 7 exposed by providing the slit openings 7a and an amount of heat discharged from the heat discharge sheet 8 to the outside is larger than an amount of heat discharged from an area corresponding to an aperture area of the slit openings 7a of the housing 7, a heat discharge property is improved.

In the present embodiment, it is possible to improve the effect attained by the sixth embodiment.

(Eighth Embodiment)

Figure 14A:
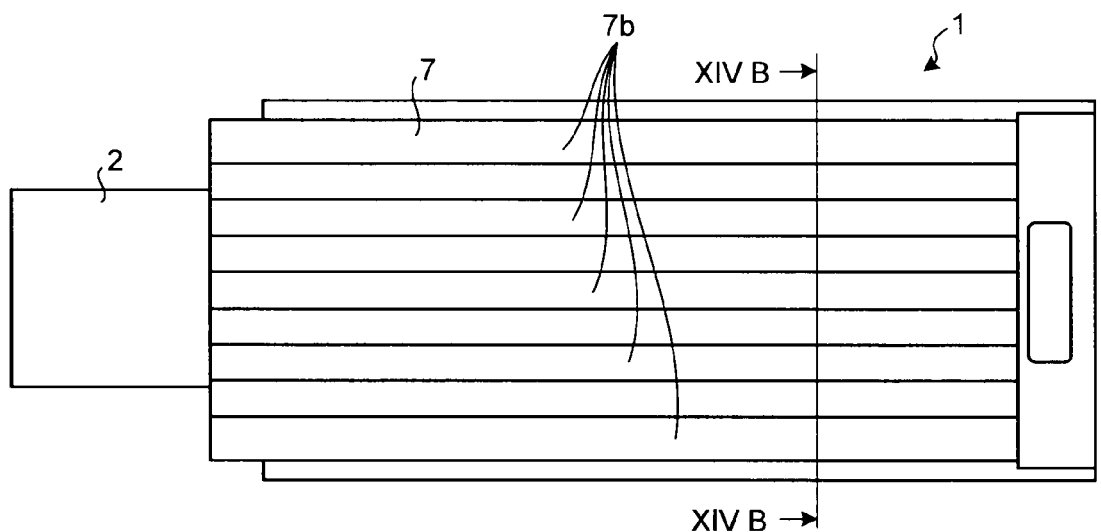
FIG. 14A to FIG. 14C are diagrams showing a configuration of a USB memory according to an eighth embodiment.
Figure 14B:
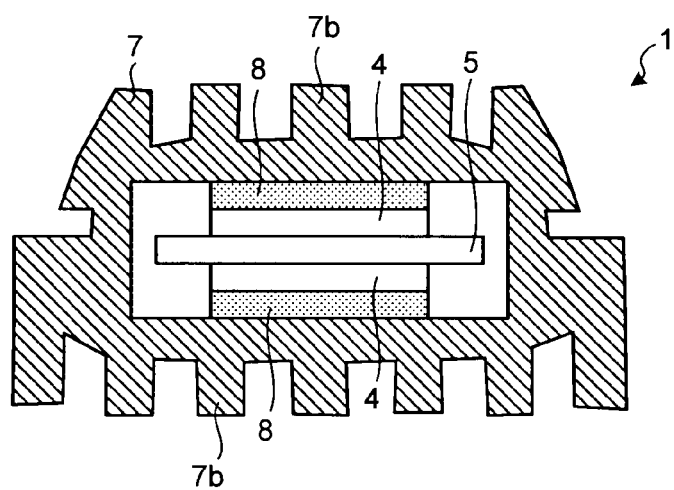
Figure 14C:
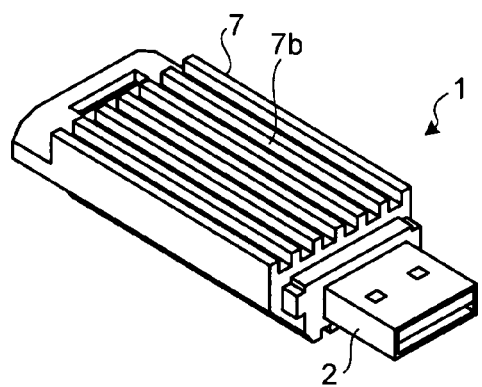

FIG. 14A to FIG. 14C are diagrams showing a configuration of a USB memory 1 according to an eighth embodiment. FIG. 14A is a top view showing the USB memory 1; FIG. 14B is a sectional view taken along a line XIVB-XIVB of FIG. 14A; and FIG. 14C is a perspective view showing the USB memory 1. The USB memory 1 in a state where a housing 7 is not attached is the same as that of the sixth embodiment. In the present embodiment, fins 7b in the form of ribs are formed on an outer surface of the housing 7, and a surface area of the outer surface of the housing 7 is increased as compared to the case where the fins 7b are not formed. Other features are the same as those of the sixth embodiment.

In the present embodiment, since the surface area of the housing 7 is increased by the fins 7b formed on the outer surface of the housing 7, heat generated from the controller 3, the memory package 4, and the like is efficiently discharged from the housing 7.

The configuration of providing the fins 7b in the form of ribs on the outer surface of the housing 7 is exemplified herein, but it is possible to increase the surface area of the outer surface of the housing 7 by providing a plurality of projections.

In the present embodiment, too, it is possible to improve the effect attained by the sixth embodiment.

(Ninth Embodiment)

Figure 15A:
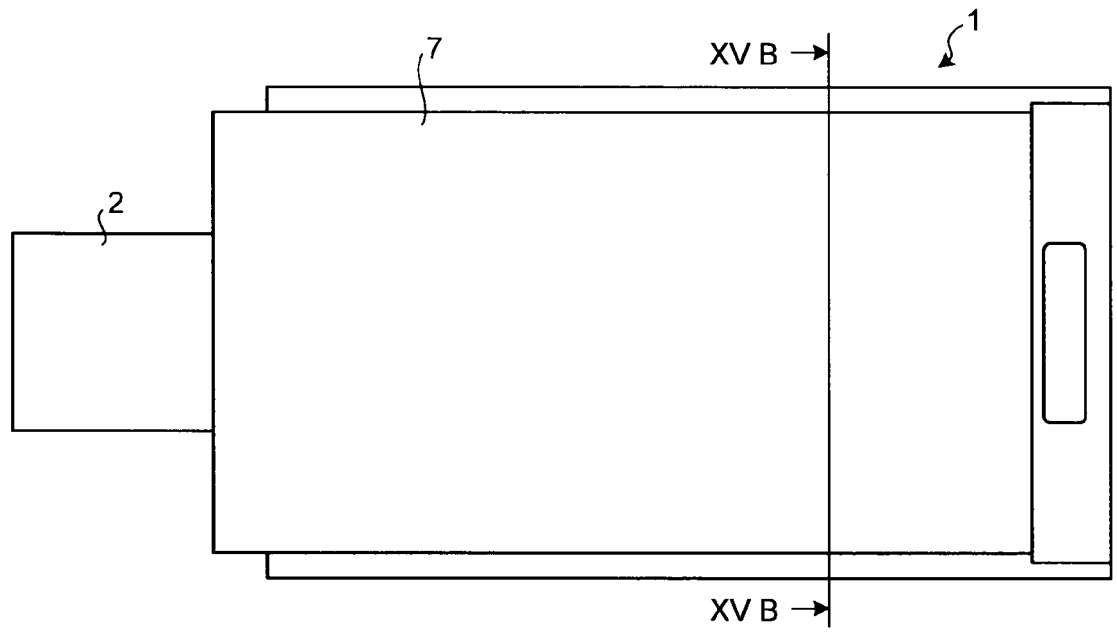
FIG. 15A to FIG. 15C are diagrams showing a configuration of a USB memory according to a ninth embodiment.
Figure 15B:
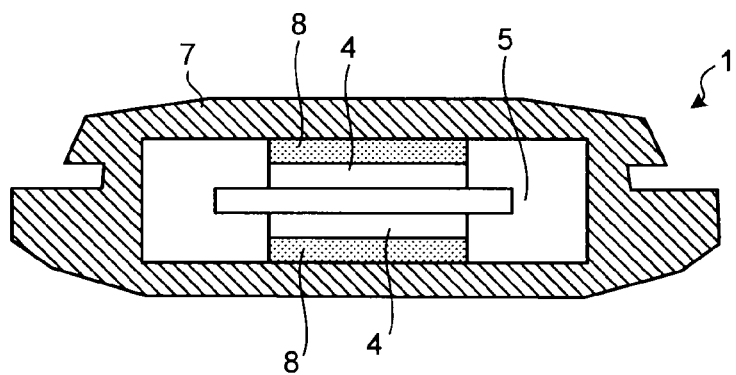
Figure 15C:
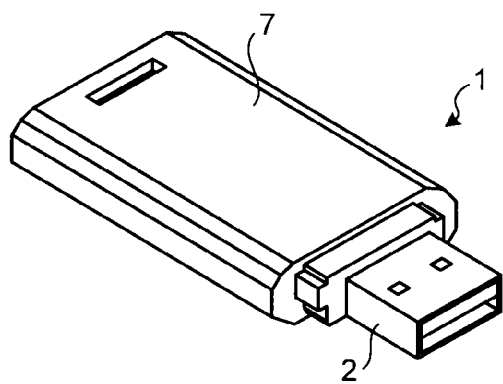

FIG. 15A to FIG. 15C are diagrams showing a configuration of a USB memory 1 according to a ninth embodiment. FIG. 15A is a top view showing the USB memory 1; FIG. 15B is a sectional view taken along a line XVB-XVB of FIG. 15A; and FIG. 15C is a perspective view showing the USB memory 1. The USB memory 1 in a state where a housing 7 is not attached is the same as that of the sixth embodiment. In the present embodiment, the housing has a wider width as compared to that of the sixth embodiment. More specifically, the width is wider than that of the resin housing of the USB memory dedicated to USB2.0. Other features are the same as those of the sixth embodiment.

In the present embodiment, since a surface area of the housing 7 is increase by increasing the width of the housing 7, heat generated from the controller 3, the memory package 4, and the like is efficiently discharged from the housing 7.

In the present embodiment, too, it is possible to improve the effect attained by the sixth embodiment.

(Tenth Embodiment)

Figure 16A:
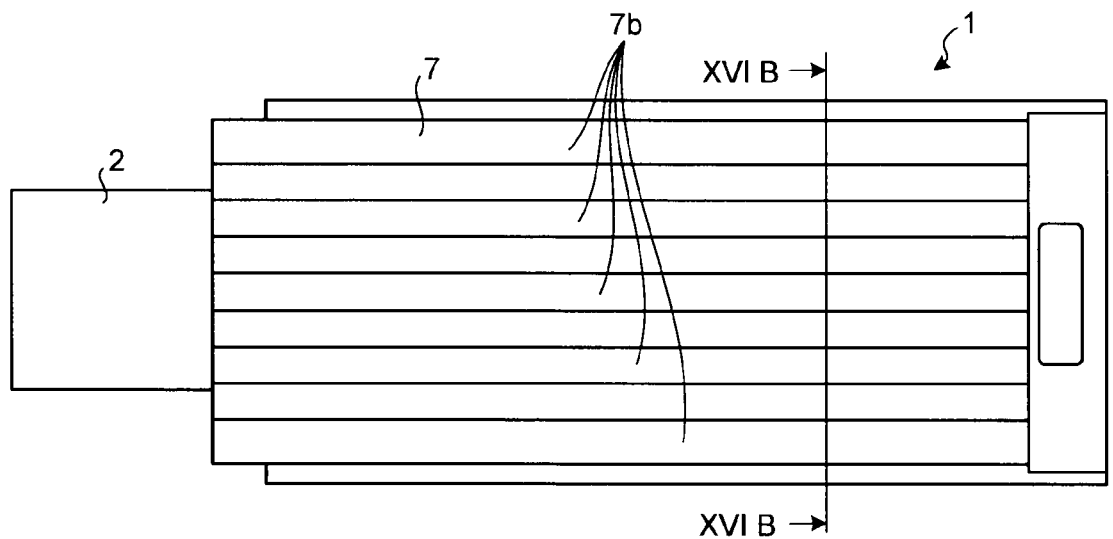
FIG. 16A to FIG. 16C are diagrams showing a configuration of a USB memory according to a tenth embodiment.
Figure 16B:
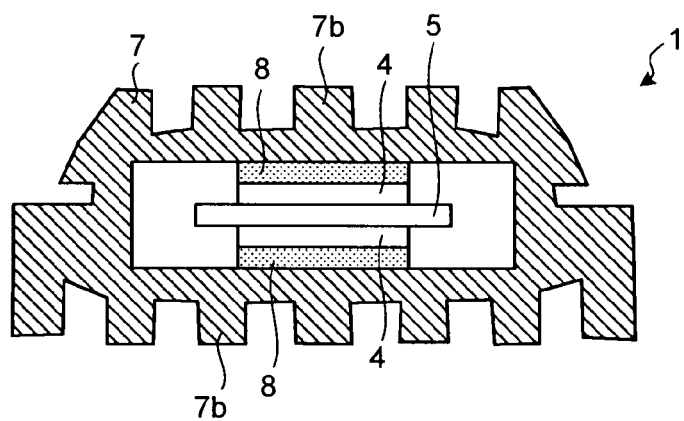
Figure 16C:
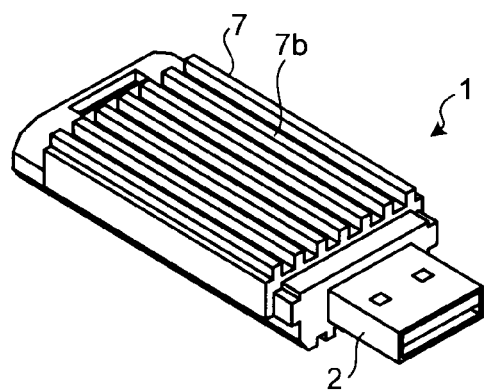

FIG. 16A to FIG. 16C are diagrams showing a configuration of a USB memory 1 according to a tenth embodiment. FIG. 16A is a top view showing the USB memory 1; FIG. 16B is a sectional view taken along a line XVIB-XVIB of FIG. 16A; and FIG. 16C is a perspective view showing the USB memory 1. The USB memory 1 in a state where a housing 7 is not attached is the same as that of the sixth embodiment. In the present embodiment, in addition to the housing 7 which has a width wider than that of the sixth embodiment, fins 7b in the form of ribs are formed on an outer surface of the housing 7. Therefore, a surface area of the housing 7 in the present embodiment is increased as compared to those of the eighth embodiment and the ninth embodiment.

In the present embodiment, too, it is possible to improve the effect attained by the sixth embodiment.

In the case where the housing 7 is formed by using aluminum as a material as in the fifth to tenth embodiments, the housing 7 may have an integral structure (in other words, in the form of a cap), not the divided structure including an upper casing and a lower casing. In such case, a substrate 5 is not sandwiched between the upper and lower casings, but the substrate 5 may be covered with the housing 7 in such a manner that the substrate 5 is inserted into the housing 7.

Figures 17A, 17B:
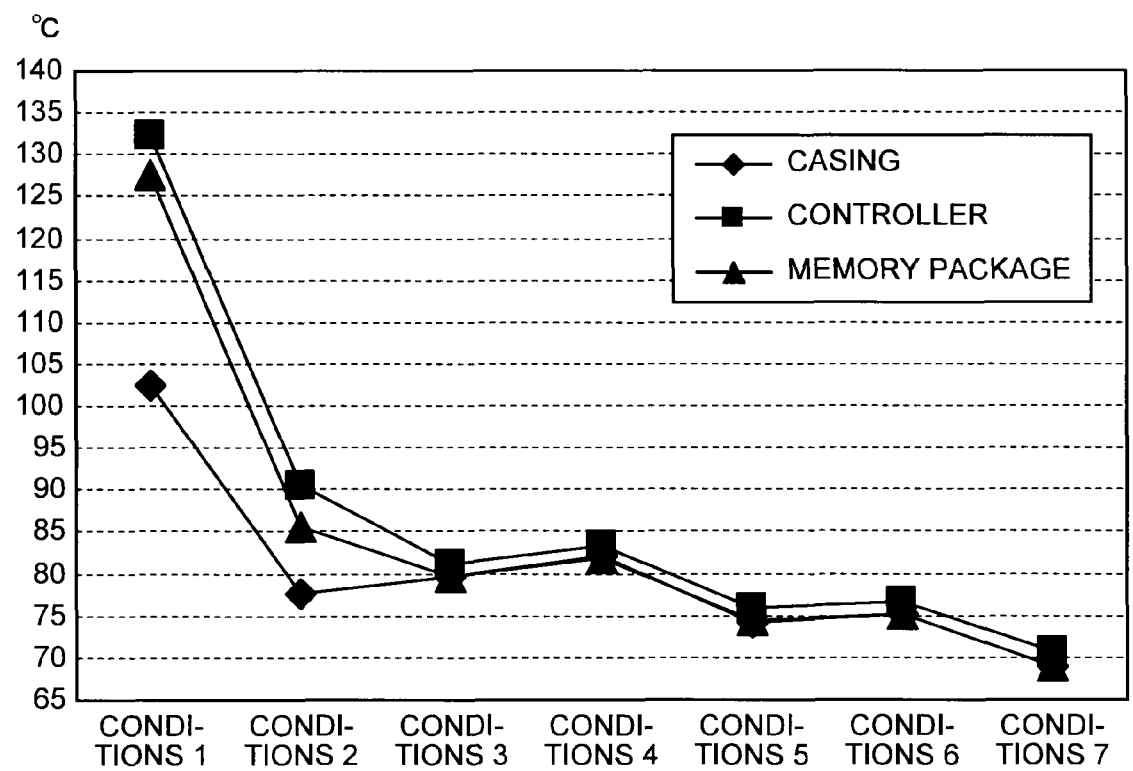
FIG. 17A and FIG. 17B are diagrams showing temperature simulation results of the USB memories according to fifth to tenth embodiments.

Here, the heat discharge properties of the USB memories 1 according to the fifth to tenth embodiments will be investigated. FIG. 17A and FIG. 17B are diagrams showing temperature simulation results of the USB memories 1 according to the fifth to tenth embodiments, wherein Conditions 2 to Conditions 7 correspond to the fifth to tenth embodiments.

Shown in FIG. 17A and FIG. 17B are temperatures of the housing 7 (upper casing side), the controller 3, and the memory package 4 when the USB memory 1 is in a stationary state by natural air cooling when disposed in a sufficiently wide space (ambient temperature is 25° C.) in a state where the USB connector 2 is not covered with any cap under an assumption that heat equivalent to a heat generation amount during operation at the maximum current (operation at the maximum power consumption) is generated in a state where the controller 3 continuously writes data to the memory package 4. Here, it is assumed that: a driving voltage of the memory package 4 is 3.3 V; and a driving voltage of the controller 3 is 5 V. It is assumed that: the maximum power consumption of each of the memory packages 4 on upper and lower surfaces of the substrate 5 is 150 mA; the maximum current of the controller 3 is 300 mA; and a current of 600 mA is supplied to the USB memory 1 as a whole at the maximum. In terms of electric power, it is assumed that: the maximum power consumption of each of the memory packages 4 on upper and lower surfaces of the substrate 5 is 0.495 W; the maximum power consumption of the controller 3 is 1.5 W; and the maximum power consumption of the USB memory 1 as a whole is 2.49 W. Also, it is assumed that the housing 7 of each of the embodiments is formed from pure aluminum (heat conductivity: 240 W/mk, emissivity: 0.8). It is assumed that the discharge sheet 8 is formed from a silicone rubber (heat conductivity: 15 W/mk, emissivity: 0.8).

Further, the housing 7 of the USB memory 1 according to each of the ninth and tenth embodiments has a width which is 1.3 times of the width of the resin housing for the USB memory for USB2.0. The resin housing of the USB memory for USB2.0 has a surface temperature of 60° C. or lower during operation.

Also, as a reference for comparison, temperature simulation results of a USB memory having a housing formed from an ABS resin (heat conductivity: 0.19 W/mk, emissivity: 0.8) are shown as Conditions 1. A shape of the housing of the USB memory is the same as that of the USB memory according to the fifth embodiment.

In the simulation results under Conditions 2 to Conditions 7, the temperatures are lower than those of Conditions 1 at the housing 7, the controller 3, and the memory package 4, and, therefore, it is confirmed that the USB memories 1 according to the embodiments are excellent in heat discharge property. From the result that the lowest temperatures were attained in the simulation results under Conditions 7, it is confirmed that a surface temperature of the housing 7 is 70° C. or lower and that the USB memory 1 has an excellent heat discharge property in the configuration that: the width of the housing 7 made from aluminum is increased; the fins 7b are provided; and the heat discharge sheet 8 is deposed inside the housing 7 to thermally connect the controller 3 and the memory package 4 to the housing 7 as in the tenth embodiment.

In each of the fifth to tenth embodiments described above, the configuration that the substrate 5 housed inside the housing 7 and the USB connector 2, the controller 3, and the memory package 4 mounted on the substrate 5 are the same as those of the first embodiment is exemplified, but such components may be the same as those of each of the second to fourth embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device configured to operate in a first mode and a second mode which is higher in speed than the first mode, comprising:
    a substrate including a plurality of wiring layers, a first mounting pad, and a second mounting pad;
    a controller mounted on a first surface of the substrate, a distance between the first mounting pad and the controller is greater than a distance between the second mounting pad and the controller;
    a semiconductor memory mounted on the first surface of the substrate and on an opposite side of the controller from the first and second mounting pads, the semiconductor memory being coupled with the controller; and
    a connector including a first terminal and a second terminal, the first terminal being connected to the first mounting pad and dedicated to data transfer in the first mode, the second terminal being connected to the second mounting pad and dedicated to data transfer in the second mode, wherein
    the second mounting pad is connected to the controller through one of the plurality of wiring layers which is formed on the first surface of the substrate.

2. The semiconductor memory device according to claim 1, wherein
    the first mounting pad is connected to the controller through at least one of the plurality of wiring layers which is different from the wiring layer formed on the first surface of the substrate.

3. The semiconductor memory device according to claim 1, wherein
    the first mounting pad is connected to the controller through one of the plurality of wiring layers which is formed on the first surface of the substrate.

4. The semiconductor memory device according to claim 1, wherein
    a wiring which connects the second mounting pad to the controller forms a differential wiring comprising at least a pair of signal lines which are parallel to each other.

5. The semiconductor memory device according to claim 4, wherein lengths of the signal lines of the differential wiring are substantially equal to each other.

6. The semiconductor memory device according to claim 1, wherein
    a pin for data transfer at the second mode of the controller is disposed at a peripheral part of the controller and a side closer to the connector.

7. The semiconductor memory device according to claim 1, further comprising a housing which houses the substrate, wherein
    the housing is made of aluminum.

8. The semiconductor memory device according to claim 7, further comprising a heat radiation member which thermally connects at least one of the semiconductor memory and the controller to the housing.

9. The semiconductor memory device according to claim 8, wherein the heat radiation member is formed of a silicone rubber.

10. The semiconductor memory device according to claim 8, wherein the heat radiation member is disposed in the housing so that the heat radiation member strides over at least one of the semiconductor memory and the controller.

11. The semiconductor memory device according to claim 8, wherein the heat radiation member is partially disposed on positions corresponding to at least one of the semiconductor memory and the controller.

12. The semiconductor memory device according to claim 8, wherein the heat radiation member has an area which is larger than an area occupied by at least one of the semiconductor memory and the controller on the substrate.

13. The semiconductor memory device according to claim 8, wherein the housing has a slit opening.

14. The semiconductor memory device according to claim 8, wherein the housing includes a fin in the form of a rib on an outer surface.

15. The semiconductor memory device according to claim 8, wherein the housing has a width wider than a resin housing of a semiconductor memory device dedicated to the first mode.

16. The semiconductor memory device according to claim 8, wherein the housing has a width which is wider than that of a resin housing of a semiconductor memory device dedicated to the first mode and has a fin in the form of a rib on an outer surface.

17. The semiconductor memory device according to claim 16, wherein the housing has a surface temperature of 70° C. or lower when the controller and the semiconductor memory operate at maximum power consumptions under an atmosphere of 25° C.

* * * * *